United States Patent [19]
Kimura

[11] 4,048,578
[45] Sept. 13, 1977

[54] R.F. AMPLIFIER CIRCUIT

[75] Inventor: Hiroshi Kimura, Nakaminato, Japan

[73] Assignee: Hitachi, Ltd., Japan

[21] Appl. No.: 736,097

[22] Filed: Oct. 27, 1976

[30] Foreign Application Priority Data

Oct. 31, 1975  Japan ............................... 50-130455

[51] Int. Cl.² ............................................. H03F 3/04
[52] U.S. Cl. ..................................... 330/31; 325/383;
330/21; 330/192
[58] Field of Search ................... 325/383, 490; 330/21,
330/31, 192

[56] References Cited

U.S. PATENT DOCUMENTS

| 1,956,121 | 4/1934 | Craig | 325/383 X |
| 2,542,087 | 2/1951 | Kreithen | 330/192 X |

*Primary Examiner*—Rudolph V. Rolinec
*Assistant Examiner*—Lawrence J. Dahl
*Attorney, Agent, or Firm*—Craig & Antonelli

[57] ABSTRACT

An R.F. amplifier circuit having a high selectivity with a simple and inexpensive construction is provided. An R.F. choke coil acting as a bias supplying element is connected to a collector of an amplifying transistor to supply it with an optimum biasing current for a high electric field strength. A first capacitor is connected in parallel, at a high frequency, with the R.F. choke coil, which is connected to an LC tuning circuit through a second capacitor. A resonance frequency of the R.F. choke coil and the first capacitor is chosen to be sufficiently lower than that of the LC tuning circuit to maintain a single tuned circuit while at the same time an output impedance of the amplifying transistor is stepped up by the first and second capacitors to insure a high quality factor.

2 Claims, 7 Drawing Figures

R.F. AMPLIFIER CIRCUIT

BACKGROUND OF THE INVENTION

1. Field of the Invention

The present invention relates to an R.F. amplifier circuit, and more particularly to an inexpensive R.F. amplifier circuit having a high quality factor Q for tuning frequency and an excellent characteristic for a high electric field strength.

In general, most important factors in measuring the performance of a radio receiver are sensitivity, selectivity, fidelity and output power. From those factors, an overall performance of the radio receiver is evaluated. Of those factors, the selectivity is an index to show ability of eliminating interference from undesired broadcasting waves and selecting only a desired broadcasting wave. Recently, since a number of broadcasting waves are radiated and the sensitivity of the radio receiver has been improved to enable the reception of a weak broadcasting wave, the chance of interference by the broadcasting waves having close frequencies has increased. The selectivity mainly depends on a performance, type and number, of tuning circuits. Generally, the higher the Q of the tuning circuit, and the greater the number of the circuits included, the higher is the selectivity.

The present invention is directed to an R.F. amplifier circuit having an excellent selectivity, which does not need to increase the number of circuits and can improve the Q of the tuning circuit with a simple and inexpensive circuit.

2. Description of the Prior Art

FIG. 1 shows a conventional R.F. amplifier circuit in which a bias to a transistor 4 is fed from a power supply terminal 3 through a resistor 13 in order to eliminate the influence of a bypassing capacitor 12 to an LC tuning circuit 11. Because of the limitation of the bias current supplied through the resistor 13, an optimum biasing current or a collector voltage of the transistor 4 for a cross modulation is not supplied. Accordingly, the conventional circuit of FIG. 1 has a drawback of interference at a high electric field strength and cross modulation.

Assuming that an output impedance of the transistor 4 is Rt, a capacitance of a capacitor 9 is $C_1$, an inductance of an inductor 10 is $L_1$, and reactances of a coupling capacitor 14 and the bypassing capacitor 12, i.e. $1/\omega WC_3$ and $1/\omega WC_2$, are sufficiently small, an equivalent circuit of the tuning circuit of FIG. 1 can be represented as shown in FIG. 2. A quality factor $\theta_1$ of the tuning circuit is given by;

$$\theta_1 = \frac{\omega C_1}{\frac{1}{Rt} + \frac{1}{R_4}}$$

As a method for improving the quality factor $\theta_1$ of the tuning circuit of FIG. 1, a variable inductor 15 of the LC tuning circuit 11 may be tapped to step up the output impedance of the transistor 4, as shown in FIG. 3. However, in general, it is very difficult and expensive to provide a tap to such a variable inductor (R.F. coil).

BRIEF SUMMARY OF THE INVENTION

According to an R.F. amplifier circuit of the present invention, an R.F. choke coil acting as a bias supplying element is connected to a collector of an amplifying transistor to supply an optimum biasing current for a high electric field strength, and a first capacitor is connected in parallel, at high frequency, with the R.F. choke coil, which is connected to an LC tuning circuit through a second capacitor. A resonance frequency of the R.F. choke coil and the first capacitor is chosen to be sufficiently lower than that of the LC tuning circuit to maintain a single-tuned circuit while at the same time an output impedance of the amplifying transistor is stepped up by the first and second transistors to insure a high quality factor of the LC tuning circuit, whereby the selectivity can be improved with a simple and inexpensive circuit configuration.

To compare with a prior art R.F. amplifier circuit, the present invention can improve an interference signal level by the amount of about 20 dB in a two-signal interference ratio with respect to radio interference and mixed modulation characteristics. Furthermore, the circuit configuration of the present invention is very simple and there is no need of providing a tap to a variable inductor. Accordingly, an inexpensive R.F. amplifier circuit may be provided.

DETAILED DESCRIPTION OF THE PREFERRED EMBODIMENTS

Figure 4:
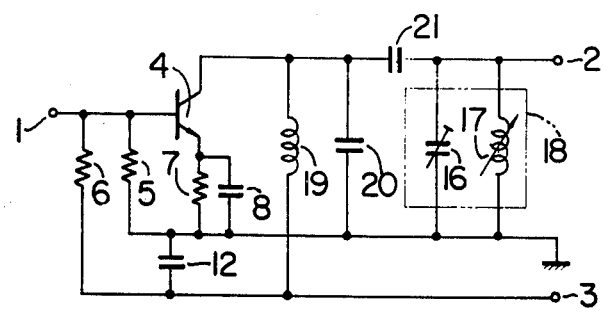
FIGS. 4 and 5 show two embodiments of an R.F. amplifier circuit of the present invention.

FIG. 4 shows one embodiment of the present invention. In FIG. 4, a base of an R.F. amplifying transistor 4 is connected to an input terminal 1. The base is also grounded through a resistor 5, and coupled, A.C. wise, to a positive voltage terminal 3 through the resistor 5 and a capacitor 12, and also coupled to the power supply terminal 3 through a resistor 6. An emitter of the transistor 4 is grounded via a parallel circuit of a resistor 7 and a capacitor 8. A collector is coupled to the power supply terminal 3 through an R.F. choke coil 19, and to an output terminal 2 through a capacitor 21. A capacitor 20 is connected between a junction of the coil 19 and the capacitor 21 and ground. An LC tuning circuit including a parallel circuit of a semi-flexed capacitor 16 and a variable inductor 17 is connected between the output terminal and the ground.

In the above circuit configuration, the R.F. choke coil 19 is chosen to have a sufficiently small D.C. resistance and an inductance which is sufficiently smaller than that of the variable inductor 17, and the capacitor 12 is chosen to have a sufficiently small reactance such that the capacitor 20 is connected in parallel, at a high frequency, with the coil 19. The capacitance of the capacitor 20 is chosen such that a resonance frequency $f_2$ of the coil 19 and the capacitor 20 is sufficiently lower than a resonance frequency $f_1$ of the LC tuning circuit 18 (88 – 108 MHz). It has been experimentally proved that in adjusting the tracking of the LC tuning circuit 18, the resonance frequencies $f_1$ and $f_2$ should meet the requirement of $100 f_2 < f_1$.

In the preferred embodiment of FIG. 4, the resistances, capacitances and inductances of the components were chosen in the following magnitudes.

Coil 19: D.C. resistance 0.5 - 1 Ω, inductance 8.2 μH
Capacitor 20: 33 pF
Capacitor 21: 6 pF
Capacitor 16: 25 pF
Resistor 5: 3.3 kΩ
Resistor 6: 10 kΩ
Resistor 7: 1 kΩ
Capacitor 8: 0.0047 μF
Capacitor 12: 0.01 μF With the above components and the circuit configuration, when the biasing voltage is supplied to the collector of the transistor 4 through the coil 19, the transistor 4 can be supplied with an optimum biasing current for a high electric field strength because the D.C. resistance of the coil 19 is sufficiently low.

Figure 5:
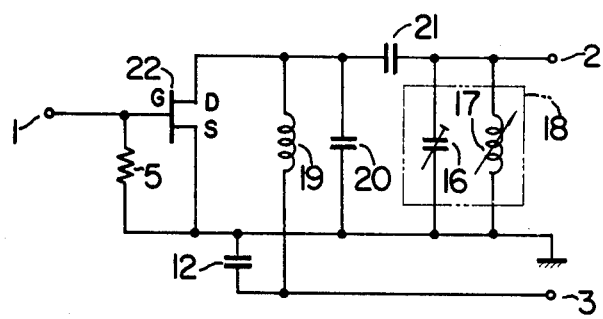

FIG. 5 shows another embodiment of the present invention in which an FET 22 is used as the amplifying transistor. In this case, a gate G of the FET 22 is connected to the input terminal 1 and also grounded through the resistor 5, and a source S is grounded, and a drain D is connected to the power supply terminal 3 through the coil 19 and to the output terminal 2 through the capacitor 21. The remaining connections are the same as in those of FIG. 4 and the specific values of the components are given below;

Coil 19: D.C. resistance 0.5 -1 Ω, inductance 8.2 μH
Capacitor 20: 15 pF
Capacitor 21: 2 pF
Capacitor 16: 22 pF
Resistor 5: 100 kΩ
Capacitor 12: 0.01 μF
Resonance frequency of LC tuning circuit: 88 - 108 MHz.

Figure 6:
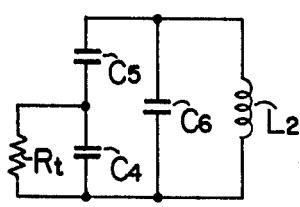
FIGS. 6 and 7 show equivalent circuits of FIGS. 4 and 5.

In FIGS. 4 and 5, assuming that an output impedance of the amplifying transistor is Rt, capacitances of the capacitors 20, 21 and 16 are $C_4$, $C_5$ and $C_6$, respectively, and an inductance of the variable inductor 17 is $L_2$, an equivalent circuit thereof may be represented as shown in FIG. 6. The equivalent circuit of FIG. 6 may be further modified as shown in FIG. 7.

A resultant capacitance $C_7$ of the equivalent circuit of FIG. 6 is given by:

$$C_7 = C_6 + (C_4 \cdot C_5/C_4 + C_5)$$

Figure 7:
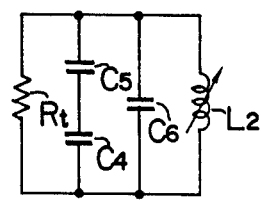

An impedance Rt' of the equivalent circuit of FIG. 7 is given by:

$$Rt' = Rt (1 + C_4/C_5)^2$$

Figure 1:
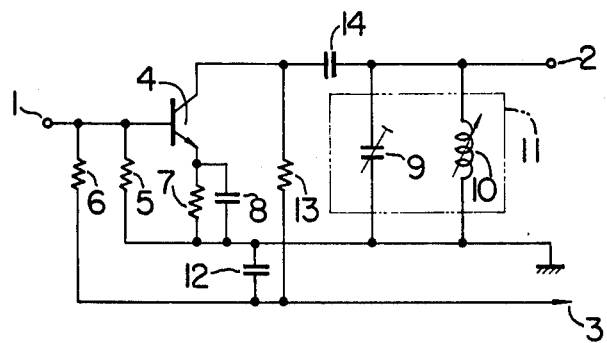
FIG. 1 shows a conventional R.F. amplifier circuit.
Figure 2:
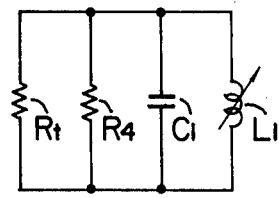
FIG. 2 shows an equivalent circuit of the R.F. amplifier circuit of FIG. 1.
Figure 3:
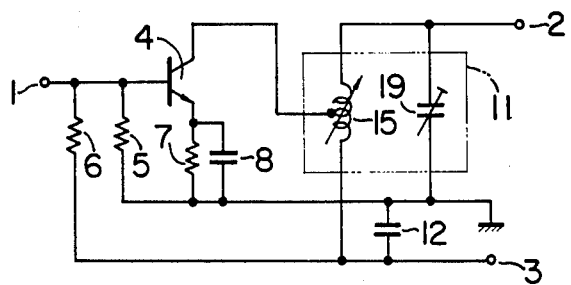
FIG. 3 shows an R.F. amplifier circuit which has an improved Q over that of the R.F. amplifier of FIG. 1.

Thus, if the $L_2$ in FIG. 6 is equal to the $L_1$ in FIG. 2, the resultant capacitance $C_7$ in FIG. 6 will be equal to the $C_1$ in FIG. 2. A quality factor $\theta_3$ of the LC tuning circuit 18 of the present invention is given by:

$$\theta_3 = \frac{\omega C_1}{\frac{1}{Rt'}} = Rt' \cdot \omega C_1$$

$$= Rt (1 + \frac{C_4}{C_5})^2 \cdot \omega C_1$$

Accordingly, by proper selection of the capacitors 20 and 21, the quality factor of the tuning circuit can be improved and the selectivity of the R.F. amplifier circuit can be enhanced.

As described hereinabove, to compare with the prior art circuit, the R.F. amplifier circuit of the present invention improves the interference signal level as much as about 20 dB in two-signal interference ratio with respect to radio interference and mixed modulation characteristics. Furthermore the circuit configuration of the present invention is very simple and it is not necessary to provide a tap to the variable inductor. Accordingly, an inexpensive R.F. amplifier circuit can be provided.

What is claimed is:
1. An R.F. amplifier circuit having an LC parallel tuning circuit at an output thereof comprising;
an R.F. choke coil connected between an output electrode of an amplifying transistor and a power supply and having a sufficiently low D.C. resistance,
a first capacitor connected between said output electrode and a ground across said amplifying transistor, and
a second capacitor connected between said output electrode and said LC parallel tuning circuit,
a resonance frequency of said first capacitor and said coil being selected to be sufficiently lower than a resonance frequency of said tuning circuit.
2. An R.F. amplifier circuit comprising;
an R.F. amplifying transistor for amplifying an R.F. input signal applied to a base thereof,
a driving power supply for said transistor,
an R.F. choke coil connected between a collector of said transistor and said power supply for supplying a collector bias current therethrough to said transistor,
a first capacitor connected between the collector and an emitter of said transistor,
a parallel resonance circuit including parallel connected inductor and capacitor, at least one of inductance and capacitance thereof being variable, and
means including a second capacitor for connecting said parallel resonance circuit across the collector and the emitter of said transistor through said second capacitor.

* * * * *